United States Patent [19]
Hoppe

[11] 3,952,203
[45] Apr. 20, 1976

[54] OBJECT ADJUSTMENT DEVICE FOR A CHARGED PARTICLE BEAM APPARATUS

[75] Inventor: Walter Hoppe, Munich, Germany

[73] Assignee: Max-Planck-Gesellschaft zur Forderung der Wissenschaften e.V., Gottingen, Germany

[22] Filed: Nov. 7, 1974

[21] Appl. No.: 521,826

Related U.S. Application Data

[63] Continuation of Ser. No. 378,422, July 12, 1973, abandoned.

[30] Foreign Application Priority Data

July 21, 1972 Germany............................ 2236530

[52] U.S. Cl................................. 250/442; 250/441; 250/311
[51] Int. Cl.² ........................................... G21K 5/06
[58] Field of Search ............. 250/491, 442, 311, 441

[56] References Cited
UNITED STATES PATENTS

| | | | |
|---|---|---|---|
| 2,510,349 | 6/1950 | Reisner | 250/442 |
| 3,086,112 | 4/1963 | Riecke | 250/442 |
| 3,240,934 | 3/1966 | Watanabe et al. | 250/442 |
| 3,435,210 | 3/1969 | Valdre | 250/442 |
| 3,444,367 | 5/1969 | Asmus | 250/442 |
| 3,476,936 | 11/1969 | Mills | 250/442 |
| 3,521,056 | 7/1970 | Suzuki | 250/442 |
| 3,628,013 | 12/1972 | Heide | 250/442 |
| 3,648,048 | 3/1972 | Cahan et al. | 250/442 |
| 3,708,662 | 1/1973 | Kuiokawa et al. | 250/442 |
| 3,761,709 | 9/1973 | Hasegawa et al. | 250/441 |

*Primary Examiner*—Archie R. Borchelt
*Assistant Examiner*—B. C. Anderson
*Attorney, Agent, or Firm*—Kenyon & Kenyon Reilly Carr & Chapin

[57] ABSTRACT

Object positioning apparatus for positioning the object to be observed in a corpuscular beam apparatus such as an electron microscope or the like having both lateral or rotational degrees of freedom in which means are provided to mechanically separate the lateral motion and rotational or tilting motion of the object whereby a point on the object can be laterally positioned on the rotational axis and after separation from the lateral moving means may then be rotated or tilted without wandering out of the field of view of the microscope.

14 Claims, 12 Drawing Figures

OBJECT ADJUSTMENT DEVICE FOR A CHARGED PARTICLE BEAM APPARATUS

This is a continuation, of application Ser. No. 378,422 filed July 12, 1973 now abandoned.

BACKGROUND OF THE INVENTION

This invention relates to a corpuscular beam apparatus in general and more particularly to improved object adjustment apparatus for such an apparatus.

Typically the object adjustment device in a corpuscular beam apparatus such as an electron microscope, generally termed the object stage contains only mechanical elements for adjusting the object carrier in a plane perpendicular to the axis of the equipment and to the electron beam. That is the equipment e.g. electron microscope will have an equipment axis upon which the electron beam is provided. For purposes of this disclosure this can be thought of as an axis in the vertical direction. (For purposes of simplicity the discussion herein will be in terms of an electron microscope. It should be recognized, however, that the present invention may be used with other types of corpuscular beam apparatus such as electron beam diffraction apparatus, ion beam microscopes, or X-ray microanalysis (microsonde).) The object to be observed in the microscope is contained in an object carrier. The object carrier is then attached to an object stage which is movable in a plane perpendicular to the equipment axis, that is, an horizontal plane. For some purposes it is desired, in addition to being able to laterally move the object to also rotate the object about an axis which is different than the axis of the equipment. In particular, it is sometimes desirable to rotate the object about an axis which is perpendicular to the axis of the equipment. Assuming the equipment axis is in vertical such another axis would lie in a horizontal plane. Another type of axis should also be defined. This is the object axis passing through the object which is perpendicular to the plane of the object. With the object carrier lying in an horizontal plane this axis through the object will coincide with the equipment axis. However, if the object plane is tilted from the horizontal on an axis lying in the horizontal plane, this object axis no longer coincides with the equipment axis but is now at an angle thereto. The two axes will intersect at the point in the object being observed. In some cases it may also be desirable to rotate a tilted object carrier about the axis through the object. In the present invention when referring to rotation both of these types of rotation are included, i.e., that corresponding to tilting and that corresponding to rotation about the tilted object axes.

An adjustment device which provides some of these capabilities is described in German Offenlegungsschrift 1,539,063. This device, however, provides axes of rotation which shift when the object carrier is linearly displaced. Thus the axis about which rotation occurs does not intersect the axis of the equipment. The result is that the point of the object which is being viewed will wander in the field of view with rotation or tilting. Although operation in which the axis of rotation will intersect the equipment axis for any lateral position can be achieved in object adjustment devices in which the specimen is laterally introduced, these devices are inferior, in regard to accuracy and stability, to the type wherein the object stage is inserted perpendicular to the equipment axis. This results from the smallness of the available space.

Thus, there is need for an adjustment apparatus for adjusting the object in an electron microscope or the like which permits lateral adjustment along with allowing rotational adjustment about ab axis which alswsys intersects the equipment axis.

SUMMARY OF THE INVENTION

The present invention provides an adjustment apparatus of this nature. It permits any point of the object to be positioned onto the tilting axis or center of rotation. This is achieved in the present invention by making the means for laterally moving the object stage and the means for rotation mechanically independent of each other. The equipment is arranged so that the object carrier can be coupled to either the object stage or the rotating arrangement. This permits inserting the object carrier and the object stage into the microscope, laterally adjusting the object until the desired point is found and then detaching the object stage and attaching it to the rotational arrangement after disengagement from the object carrier. Thus, the axis of the rotational arrangement remains fixed, intersecting the equipment axis and, after the necessary lateral adjustment the proper point about which rotation is desired will fall on the rotational axis. This, in turn causes the point being viewed to remain in the field of view as the object is rotated or tilted.

This separation of the functions of linear displacement and rotation allows providing optimal mechanical arrangements for both without being impeded by physical constraints. Thus, a conventional object stage with its associated object lock can be used as the specimen stage. In one embodiment of the invention means are provided for rotating the object carrier about an axis which is parallel to the equipment axis. With such an arrangement the object stage is placed in an object cartridge having a rotating device. Such object carriers are shown in German Offenlegungsschrift 1,539,063. In general such object carriers which provide only rotation about an axis parallel to the equipment axis are not of interest in electron microscopes since they only cause the picture to remain unchanged as it rotates in the fluorescent screen. However, when combined with the present invention, such a rotational arrangement permits adjusting a particular axis of the object so that it is parallel to the tilting axis before coupling the object carrier with the tilting arrangement. That is to say, when speaking of a particular axis of the object in this case an axis in the plane of the object is being referred to. Thus, the object may be rotationally aligned so that any given line or axis through the object and in the plane of the object is parallel to the axis about which the object will be rotated by the rotational arrangement. In a further arrangement, the object carrier is arranged to lie in a plane which is tilted to the horizontal. Means are then provided to rotate the object about an axis perpendicular to the non-horizontal object plane. Thus the object may be rotated about an axis intersecting the equipment axis and which is perpendicular to the object without it wandering out of the picture.

The mechanical elements used in tilting and/or rotation may be arranged in the gap of the objective lens of the electron microscope. The arrangement can be simply implemented since neither linear displacement elements nor separate object locking devices are required with the rotating arrangement.

In one embodiment of the last type mentioned, i.e., where the object is to be rotated about an axis perpendicular to itself which makes an angle with the equipment axis, the angle is chosen to be larger than 0 but smaller than 90°. The object carrier is then guided so that it moves in a plane perpendicular to the tilted axis. When rotating about the tilted axis information about the special structure of the object obtained through the use of a plurality of electron microscope shots showing the object with a fixed tilt but at a different azimuth angle may be obtained.

Various means of transferring the object carrier from the object stage to the rotating arrangement are shown. In one arrangement tong-like grippers or jaws hold the object carrier to the object stage (or to the object cartridge if one is inserted into the object stage). The object carrier is lowered against the rotating arrangement where it is attached by adhesion whereupon the jaws are released to permit the object carrier the freedom to rotate with the rotating arrangement. In another embodiment the coupling device is arranged such that the object carrier is inserted into a sleeve which is held in the rotating arrangement by spring pressure in a manner such that it can be moved relative to the rotating arrangement as the object stage is laterally moved. In still a further embodiment, the object carrier comprises two parts which are movable with respect to each other, one of which contains the object and the other of which is arranged to be inserted in an opening of the rotating arrangement. The object stage with the two part object carrier is inserted into the electron microscope with the one part of the object carrier in the rotating arrangement. This part then remains fixed while the other part may move laterally with the stage. The other part may then be detached from the stage while maintaining direct contact with the part inserted into the rotating arrangement. This insures that the object does not change its position when it is decoupled from the object stage.

Also shown is a system for maintaining high precision of the rotating arrangement. This system essentially comprises measuring devices which measure the distances of the axis of rotation from parts fixed in the equipment which measurements are compared with predetermined references values and the difference therebetween used to control displacement means which act upon the bearing supporting the rotational member to maintain the axis properly positioned. Thus an ideal axis which is extremely stationary may be maintained. In addition, the control means also provide in one embodiment the capability of shifting the ideal axis of rotation by predetermined amounts to thereby provide for fine adjustment of the object point which intersects the equipment axis. Also this arrangement may be used for moving the object perpendicular to the equipment axis.

DETAILED DESCRIPTION OF THE PREFERRED EMBODIMENT

Figure 1:
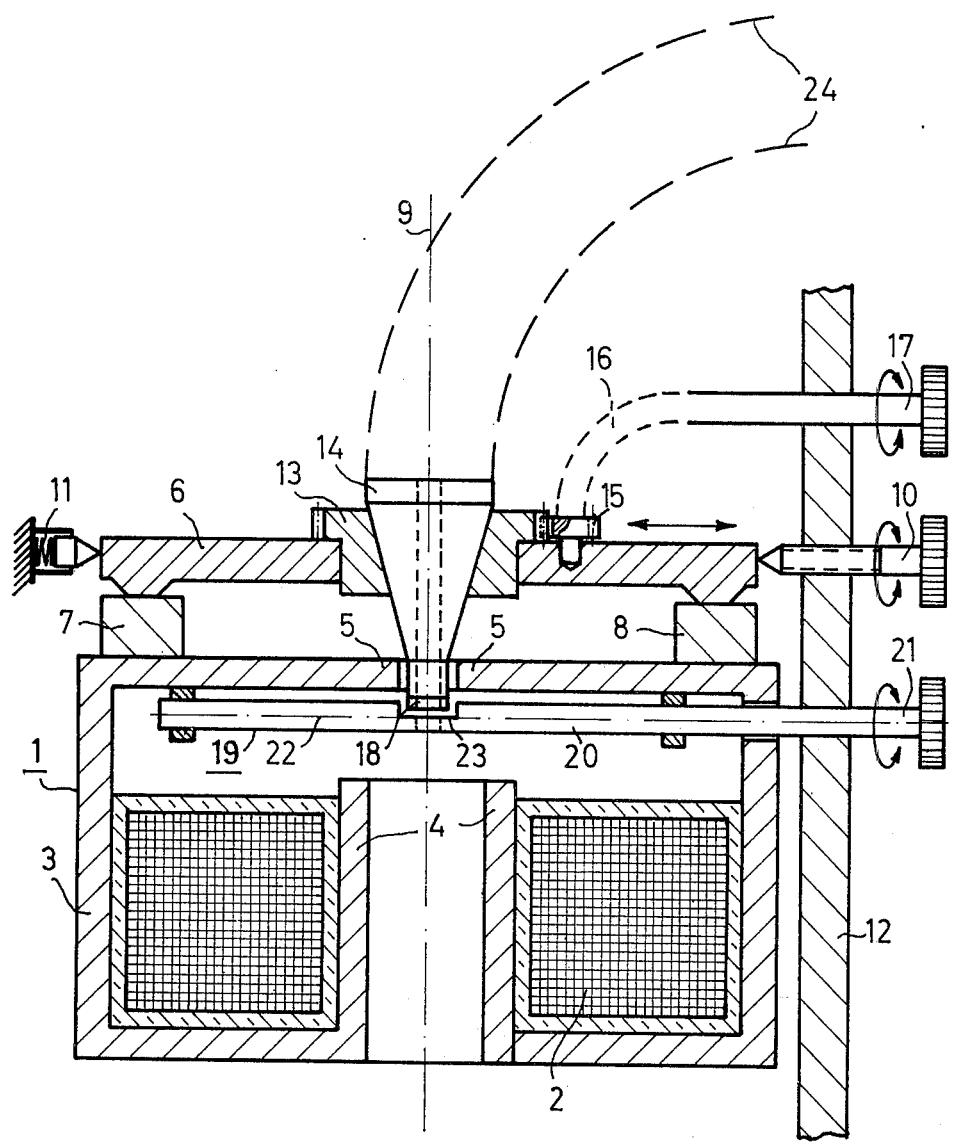
FIG. 1 is an elevation view partially in cross-section illustrating a first embodiment of the present invention.

FIG. 1 illustrates a first embodiment of the present invention in which the rotational arrangement is installed having an axis which is perpendicular to the equipment axis. This arrangement is installed at the objective lens of the electron microscope which is designated generally by the number 1. The objective lens comprises the winding 2 and iron enclosure 3. The lens gap is formed by the lower pole piece 4 and the upper pole plate 5. Mounted above the upper pole plate 5 is the object stage 6. Object stage 6 is movable on precision ways 7 and 8 along two axes in a plane perpendicular to the equipment axis 9. To accomplish this movement an adjustment screw 10 is shown which acts against the side of the object stage 6. On the other side of stage 6 there is provided a return spring loaded member which keeps the stage tightly against the adjustment screw 10. A similar adjustment screw will be provided for the axis perpendicular to that indicated by a double headed arrow. The portions of the assembly shown on FIG. 1. are contained within a vacuum-tight area defined on one side by wall 12. The adjustment screw 10 is brought through the wall in a vacuum-tight manner as are all the other controls to be described below. The center of the object stage 6 contains an opening into which is inserted insert 13 which is rotatable relative to the object stage about an axis parallel to the equipment axis 9; a pinion 15 which is driven to a flexible shaft coupled to a knob 17 outside the microscope is used to rotate insert 13. Within the insert 13 is placed an object cartridge 14 which has attached to its bottom an object carrier 18 which contains the object to be viewed. Cartridge 14 is inserted through an air lock along the tracks 24 in a well known manner. Below pole plate 15 is the tilting arrangement designated generally as 19. It comprises a rod 20 which is supported for rotation about an axis 22 in suitable bearing means which are attached to the plate 5. The rod 20 passes through the wall 12 and has on its end a knob 21 used for controlling the tilt of the rod. In its center portion, the rod 20 contains a recess 23 having a planar portion upon which the object carrier 18 may be placed. The depth of the recess is such that the object will be located on the tilting axis 22 when the object carrier is in place.

In operation, the object carrier 14 is inserted into the microscope with the tilt angle of the rod 20 being 0° so that the plane of opening 23 is horizontal. The object is observed on the screen and lateral adjustment made until the desired point of the object is on the equipment axis 9. Since the equipment axis and the tilting axis 22 intersect at the center of the field of view the desired point will be right on the tilting axis. Marks on the fluorescent screen may be provided for this alignment. The object carrier is then detached from the object cartridge 14 and coupled to the rod 20 after which the object cartridge is raised a small amount using, for example, a lock arrangement or a height adjustment. The object carrier is then free to be tilted by the rod 20. In this manner the desired point on the object can be aligned with the tilting axis 22 prior to disengaging the object carrier from the object cartridge 14 thus permitting tilting about the desired axis on the object after decoupling the object carrier 18 from the object cartridge 14 and coupling it to the rod 20.

Other types of object cartridges may be used such as those which include a built-in device for rotating the object carrier. In that case the rotatable insert 13 would not be required. Turning the rod 20 about the tilt axis 22 will permit a plurality of shots of the object to be made at different tilt angles in whatever sequence desired. After the necessary shots are completed, the object carrier 18 is then coupled to the object cartridge 14 again and may then be removed through the air lock in conventional fashion.

Figure 2:
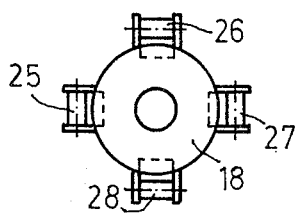
FIG. 2 is a plan view illustrating the grippers holding the object carrier of the present invention.
Figure 3:
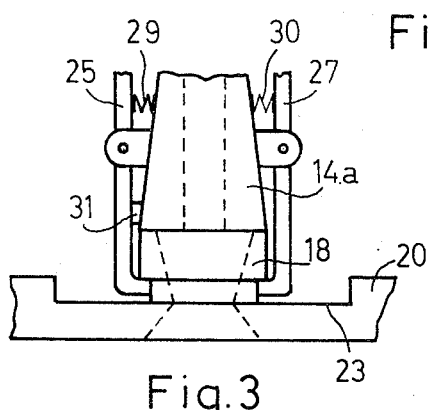
FIG. 3 is an elevation view showing the gripper arrangement of FIG. 2 and the coupling of the object carrier to the rotational arrangement of FIG. 1.
Figure 4:
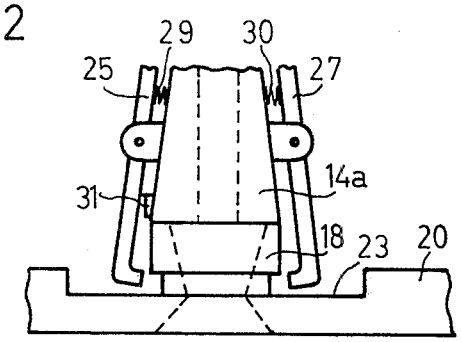
FIG. 4 is an elevation view similar to that of FIG. 3 showing the grippers in the opened position.

It is of course essential that the transfer of the object carrier from the object cartridge 14 to the rod 20 be made in such a manner that no lateral change in position occurs during the transfer. A first arrangement for accomplishing this is illustrated by FIGS. 2 to 4. In the embodiment illustrated, the numeral 14a designates the lower neck of the object cartridge 14 of FIG. 1. As shown on FIG. 3 the object carrier is held onto the object cartridge 14 by a plurality of grippers. In the view of FIG. 3 grippers 25 and 27 are visible. Two additional grippers 26 and 28 are also provided as shown in FIG. 2. The object carrier 18 may be provided with a plurality of apertures around its edge into which the ends of the grippers will be placed. Conventional arrangements for operating the grippers may be provided. These may comprise means for lifting all jaws simultaneously in the manner of a chuck or means for lifting the jaws in a predetermined sequence. This latter means of decoupling is particularly advantageous in avoiding any motion of the object carrier during decoupling. In such a case the contact pressures of the opposite jaws should be made different and the jaw with the lower pressure lifted first. In the embodiments of FIGS. 3 and 4 the jaw 25 is provided with a compression spring 29 which is placed between the jaw 25 and the object cartridge 14. In similar manner the jaw 27 has a compression spring 30 placed between it and the cartridge 14. Spring 30 is selected to be weaker than spring 29. In addition the movement of the jaw 25 is limited by a stop 31 attached to the object cartridge 14. In disengaging, the jaw 27 is first lifted and then the jaw 25. Similar arrangements are provided for the jaws 26 and 28. Attachment of the object carrier to the rod 20 is accomplished by adhesion or sticking. To do this a small amount of a non-gasing grease is applied to the lower side of the object carrier 18. When the object carriage is placed through the lock the object carrier 18 seats itself on the smooth plane surface of the recess 23. With the rod 20 in its normal horizontal position, movement of the object carrier with the object stage 6 can be accomplished without any appreciable trouble since the object carrier 18 will freely slide on the plane surface of the recess 23. However, when the jaws 27, 25, 26 and 28 are open the object carrier 18 will be firmly held in position. After this point the object cartridge 14 may be raised out of the way of the object carrier 18. The adhesion obtained through a small amount of grease in this manner will be sufficient to hold the object carrier 18 in place since the object carrier will be of very light weight. It is important however that the object stage remain fixed between the time when the object cartridge is decoupled from the object carrier 18 and the time when it is again coupled to remove the object carrier. For this purpose mechanical or electro-magnetic locking devices such as are conventionally found on electron microscopes may be used for locking the adjustment screw 10 shown on FIG. 1.

It should be noted that an adhesive such as grease placed between the object carrier and the rod 20 is not absolutely necessary to establish the needed adhesive. Direct molecular adhesion may be used if the surfaces of the parts of 18 and 20 are highly polished.

Figure 5:
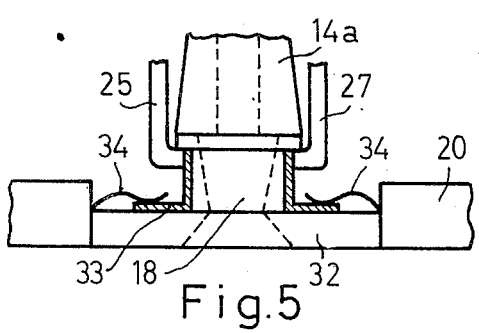
FIG. 5 is an elevation view illustrating a second means of transferring the object carrier from the object stage to the rotating arrangement.
Figure 7:
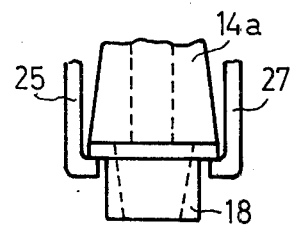
FIG. 7 is an elevation view of the arrangement of FIG. 5 showing the object carrier detached from the rotating means.
Figure 6:
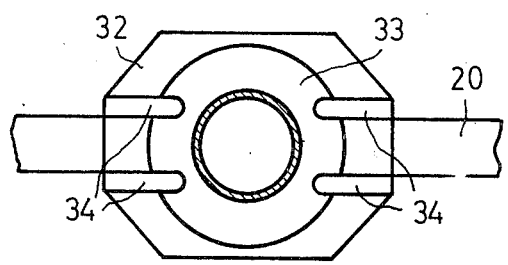
FIG. 6 is a plan view of the arrangement of FIG. 5.

A further embodiment for coupling is illustrated by FIGS. 5, 6 and 7. As shown the rod 20 has a plate shaped portion 32 at its center. The plate 32 is ground flat on its top side with a high degree of accuracy. A hat 33 is placed on top of the plate 32 and held in place by springs 34 in a manner so that it is free to slide. The hat 33 contains an opening on its top which can accept the bottom portion of the object carrier. The object cartridge with the object carrier is inserted into the microscope so that the bottom portion of the object carrier 18 fits into the opening in the hat 33. Lateral adjustment of the object stage may then be accomplished with the hat 33 sliding on the plate 32. When the object is properly positioned the jaws 25 and 27 may be removed in the manner described above releasing the object carrier which will remain properly positioned within the hat 33 after which the object cartridge may be retracted. If the object cartridge is designed for rotation about an axis parallel to the equipment axis, then the object carrier 18 will be free to rotate within the hat 33 or, alternatively, the hat 33 may rotate along with the object carrier 18.

It should be noted that in this embodiment the object carrier 18 must be inserted in a predefined object stage position so that the object carrier 18 will properly fit into the opening of the hat 33. For this reason it is preferable to establish a defined position for insertion, e.g., with no object stage offset. Similarly it is advisable to go back to a position such as this after reengaging the jaws of the object cartridge and the object carrier so that the hat is properly positioned to receive the next object carrier. For this purpose suitable locking devices which will place the various adjustments in the proper position may be used.

Figure 8:
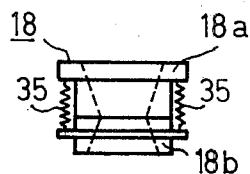
FIG. 8 is an elevation view showing a coupling arrangement wherein the object carrier is split into two parts.

In the embodiment illustrated by FIG. 8 the sliding arrangement is built into the object carrier itself. The object carrier 18 comprises two parts 18a and 18b with the object attached to the bottom side of part 18a. The two parts 18a and 18b are joined in a manner such that they can be slid relative to one another. Such a sliding joint can easily be obtained by using vacuum grease similar to that described in connection with FIGS. 2 to 4. When using an object carrier of this nature, the rod 20 is provided with a matching hole into which the part 18b is inserted. This arrangement is particularly advantageous since the rod will not have to come in contact with the grease. The two parts 18a and 18b may also be connected using tension springs 35 as shown on FIG. 8. These will permit lateral displacement within certain limits. Such a displacement will cause a restoring force. However, this force can be ignored for the small displacements involved here, particularly if the spring excursion is long as compared to the amount of displacement.

Figure 9:
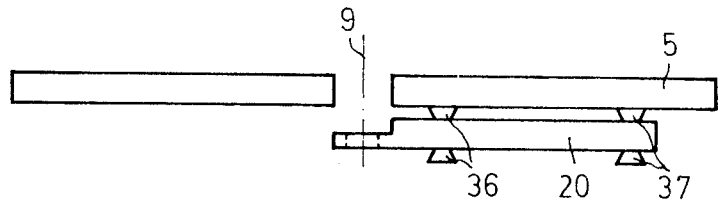
FIG. 9 is an elevation view illustrating an alternative means of mounting the rotational arrangement of FIG. 1.

FIG. 9 illustrates an alternate method of mounting rod 20. Here the rod 20 is supported on only one side by bearings 36 and 37 which are attached to the pole plate 5.

Figure 10:
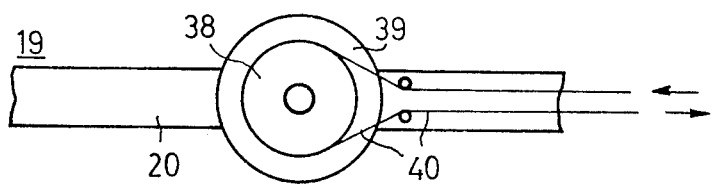
FIG. 10 is a plan view illustrating means for rotating the object carrier about an axis parallel to the equipment axis.

FIG. 10 illustrates the manner in which the tilting rod 20 may be provided with a rotational bearing which may be controlled from outside the microscope. This permits rotating the object while at any tilt angle. As shown a rotational member 38 is supported for rotation about an axis through the center of the rod on a center part 39. Rotation is accomplished through a drive arrangement such as a filament or belt 40 which is led through a hollow portion of the rod 20 and out to a suitable driving means.

Figure 11:
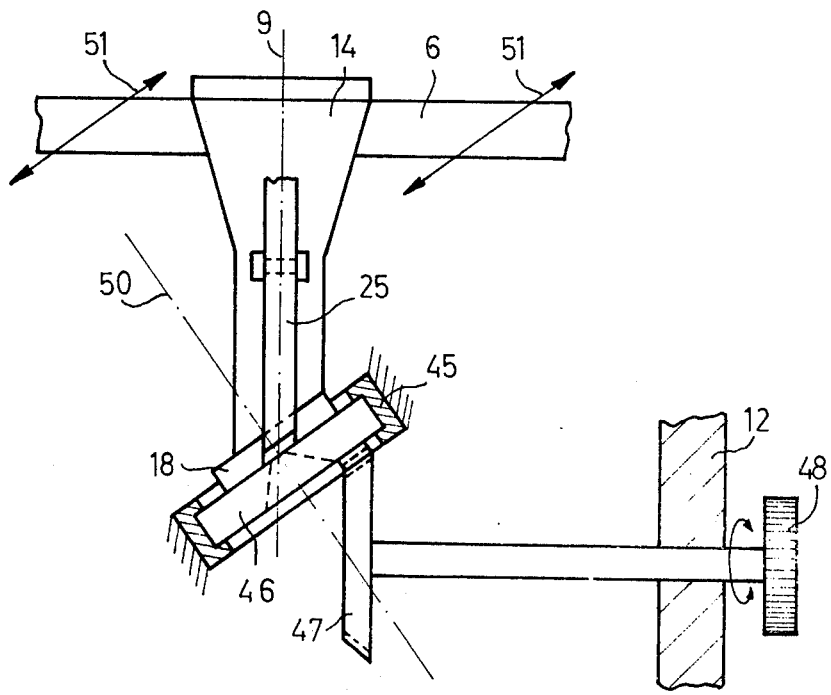
FIG. 11 is an elevation view illustrating means for rotating the object about an axis which is tilted with respect to the equipment axis.

FIG. 11 illustrates another embodiment of the invention in which the object carrier is adapted for rotation about a fixed axis through the object which is inclined to the equipment axis. Within the bore of the microscope objective, a bearing 45 is placed which supports a disc shaped rotating body 46 which is adapted to be rotated by a double gear drive 47 which has a shaft which is led out through the wall 12 to a knob 48. Movement of the knob 48 will result in rotation of the member 46 about an axis 50 which is inclined with respect to the equipment axis 9 a fixed amount. In the illustrated embodiment a tilt of approximately 45° is shown. The object carriage is mounted so that it has a beveled lower end upon which the object carrier is mounted, it too being beveled. The object carrier 18 is detachable from the object cartridge 14 by means of the two jaw grippers 25 similar to that described above. The object carrier 18 is mounted for lateral movement not in the horizontal plane but in a plane perpendicular to the axis 50, i.e., in the direction of arrows 51. Alternatively, means may be provided for moving the object stage 6 horizontally while at the same time providing for height adjustment of the object cartridge 14, such motion being coupled to the motion of the object stage 6 so as to result in a motion at the object carrier which corresponds to the motion of the direction of arrows 51. In this manner the object carrier 18 will always move parallel to the flat planar surface of the rotating disc 46.

Operation with this arrangement is similar to that described above except that the object is moved at an angle i.e., in a plane normal to the axis 50. As before, it is observed while adjusting the object stage 6. While doing this the point of the object on the equipment axis will always remain in focus despite the inclined displacements. When the desired point on the object is found, the jaws are opened and the object carrier held in place on the disc 46 by adhesion such as that described above at which point the object carrier may be rotated about the axis 50. After making several shots of the object at various angles of rotation, all of which will be at a fixed tilt angle, the grippers 25 can again be engaged and the object carrier removed along with the object cartridge 14 through the air lock.

As described above, the present invention assures that the desired point of the object is positioned on the tilting axis 22 for example such that it will not wander off as it is rotated. However, at high magnification problems may exist since mechanical bearings such as the bearings supporting the rod 20 at the pole plate 5 of FIG. 1 can at best be made to an accuracy in the range of 0.1 to 1 micron. These errors can however be compensated by the system to now be described.

Figure 12:
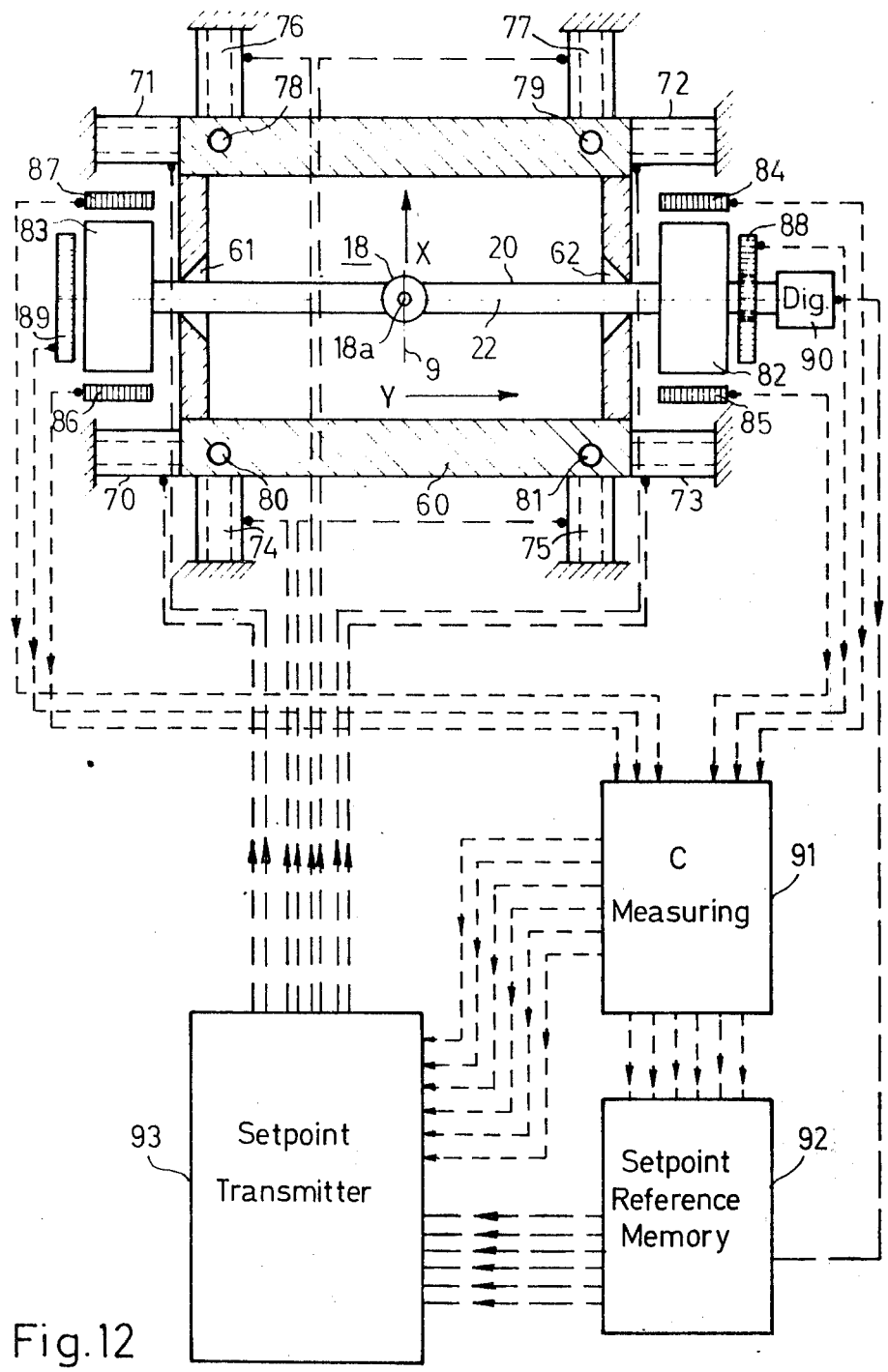
FIG. 12 is an elevation view partially in cross-section and partially in block diagram form illustrating a system for maintaining high rotational accuracy in the rotational arrangement of the present invention.

Apparatus to compensate for these errors is shown on FIG. 12. The shaft 20 is supported for rotation in bearings 61 and 62. In the center of the shaft 20 is a hole 18 in which an object carrier may be placed to hold the specimen 18a. The shaft 5 will be supported by the mechanical sliding bearings 61 and 62 which will be designed to have the highest possible accuracy. Bearings 61 and 62 are arranged in a frame 60 which is movable in the X and Y directions in a manner to be described below. The ability to move in the X and Y directions need only be confined to a small amount of motion sufficient to make up for the tolerance of the bearings. However, it is necessary that the means driving the frame 60 in the X & Y directions have a resolution capability in the order of a few Angstroms. This type of movement can be achieved with some mechanical devices. However, for this application, electrostrictive or magnetostrictive drives which can be built, for example, in a well known manner using piezoceramic tubes having inside and outside electrodes are particularly useful. In the embodiment of FIG. 12, four piezoceramic positioning members 70, 71, 72 and 73 are used to provide for displacement in the Y direction. Similarly, four positioning members 74, 75, 76 and 77 are used to obtain displacement in the X direction. Such displacement is obtained by applying voltages to the electrodes of the tubes which will result in small parallel displacements in the X or Y direction. Frame 60 may be supported for sliding motion on a base. However, since the displacements involved are extremely small, it can equally well be supported by rods having elastic deformability in the X and Y directions. Thus, on FIG. 12 there are shown four rods, 78, 79, 80 and 81 from which the frame 60 is suspended.

On the surface it might appear that it would be sufficient to determine through calibration, the voltages required for each given annular position of the shaft 5 which are needed to be applied to the positioning members 70, 71, 72 and 73 and members 74, 75, 76 and 77 to maintain the specimen 18a in the desired position as the shaft 20 is rotated. This however, is not sufficient since the shaft wanders in a completely irregular path as it is rotated and, when returned to the same rotational position after being moved therefrom, will generally require a different correction.

To get around this problem, the displacement devices are controlled in response to a distance measuring device. In the embodiment of FIG. 12, the ends of shaft 20 have attached thereto cylindrical members 82 and 83 which are either made of a conductive material or provided with a conductive surface. These are then used to provide one plate of a capacitor. At an extremely small spacing from the cylinder, plate shaped vertically disposed electrodes 84, 85, 86, 87, 88 and 89 are provided. These plates along with the cylindrical members 83 and 82 thereby form a plurality of capacitors. Since the plate size will always remain fixed the only variable will be the distance between the plates and thus, by measuring the capacity of each of the capacitors so formed, an indication of the spacing and positioning of the shaft 20 may be obtained. The measurements so made will only be relative. This is true since the cylinders can be machined only with a finite mechanical tolerance. Even if the shaft could be positioned with absolute accuracy, the gap of the capacitors would change during rotation because of inaccuracies in the cylinder radius. However, making the assumption of absolute accuracy for the bearings, the inaccuracy in the cylinders will remain constant. Thus, for each angular position of the shaft the spacing between the electrodes 84 through 89 will be the same. Thus, for every angular position of rotation a set of capacity values may be defined. By measuring the capacities during a calibration stage, and then comparing with actual measured values, it is then possible to position the frame 60 so that for a given angular rotation the predetermined values and the measured values are equal. When this is done, the shaft 20 and the specimen carried thereon will be properly positioned.

Calibration may be accomplished by making absolute measurements of the position of the axis of rotation as it is rotated around. In an electron, defraction apparatus, such an absolute measurement is possible if the apparatus has been designed, for example, as the fine range defraction device in an electron microscope. Where means are provided to observe the object 18a, through the electron microscope, its lateral displacements can be observed directly on the electron microscope picture.

Attached to the shaft 20 is a digitizer 90 which may comprise a shaft encoder and will output a digital word corresponding to the angular position of the shaft 20. Each of the capacitor plates is connected to a capacity measuring device 91. The outputs of the capacitor measuring device 91 and the output of digitizer 90 are both provided as inputs to a set point reference memory 92 in which calibration values are stored. The outputs of the capacity measuring device and the set-point reference memory 92 are provided to a set-point transmitter 93 which provides output signals to the electrodes of the tubes 70 through 77. During calibration, the object 18a is observed and the outputs of the set point transmitter varied until it is properly positioned. At that point, the output of digitizer 90 indicating the angular position and the capacities measured from the capacitors made up of plates 82–84, 82–85, 82–86, 82–87, 82–88 and 82–89 are stored in the set-point reference memory. This process is repeated for a number of angles with the angle and the capacities corresponding to proper positioning of the shaft 20 stored for each position. When finished, the set-point reference memory 92 will have stored therein, a plurality of angular positions and associated with each angular position the proper capacity values for the desired shaft position. In the capacity measuring device 91 a plurality of capacitance bridges or the like may be provided one for each capacitor or, alternatively, a single bridge provided along with means to sequentially measure each of the values. The former is preferable if high rates of rotation must be handled. Since it is preferable to store these values in digital form, the capacity measuring device should also include one or more analog digital converters which will convert the analog voltage corresponding to the measured capacitance into a digital value which may easily be stored in the memory 91.

Once all the values are stored, the system may be operated, the shaft 20 will be rotated to obtain the desired amount of tilt. The capacity measuring device will then measure each of the capacitances and provide them to the set-point transmitter. In response to the digitizer output indicating the shaft angle, the reference values for that particular angle will be provided as outputs from the set-point reference memory to the set-point transmitter 93. In the set-point transmitter 93 the reference values will be compared with the measured values and the error signals used to provide output voltages to the positioning members 70–71, 72–73, 74–75 and 76–77. These voltages will be varied until the measured capacitance values are equal to the stored capacitance values at which point the shaft 20 will be properly positioned.

Note the importance of storing the measured capacity values rather than storing the voltages needed to position the shaft. The voltages may vary from time to time because of the shaft wobble and thus different voltages may be required for properly positioning the shaft even when the tilt angle is the same. As described, only a finite set of shaft angles are stored, thereby indicating that only tilts of these angles may be accurately used. However, if the measurements are close enough together then tilt angles between those measured may also be used and interpolation between the measured angles performed. It should be noted however, that in many applications the limitation to a discrete set of tilt angles is sufficient.

In the embodiment of FIG. 12, capacity measurement was used to measure distances. However, it is also possible to use inductive or piezoelectric transmitters to perform this measurement. In addition, optical methods, such as light-optical interference methods or electron-optical methods may also be used. When using these later methods, particularly the electron-optical methods, it is also possible to determine the reference and actual values by an absolute length measuring method, in which case the use of the electron microscope in the calibration can be dispensed with.

In the arrangements of FIG. 12 it is important that regardless of whether relative or absolute length measurements are made, that the individual coordinates be coupled to each other. These arrangements of FIG. 12 do not provide compensation of the Z axis which in this Figure is the axis perpendicular to the plane of the paper. It should be noted however, that both of these arrangements can be extended so that motion of the Z axis, i.e., the axis of rotation can also be compensated in the Z axis direction. In FIG. 12 this can simply be accomplished by replacing the supports 78 through 81 with piezoelectric positioning members and by providing additional capacitor electrodes similar to electrodes 84, 85, 86 and 87 but perpendicular thereto.

As noted above, the frame 60 can be supported by additional electrostrictive elements to obtain Z displacement. In that case, as is the case with the members shown in FIG. 12, the electrostrictive elements will be elastically stretched to some degree. For example, action of the displacement elements 70, 71, 72 and 73 will result in a small degree of elastic stretching of the elements 74 through 77. However, since these displacements are very small, any changes in the properties of the elements resulting therefrom can be ignored. It should also be noted that since these elements are used only for positioning and not for measuring, a change in their property will properly be compensated for if an interative process is followed in positioning the frame 60.

If all coordinates of the bearing are to be compensated, independence of the set-point values of individual coordinates with respect to each other is no longer extremely important.

The control devices used to provide an output to the positioning members in response to the measured and reference values can be of conventional design. That is they may comprise elements such as summing amplifiers, comparators, analog to digital and digital to analog converters and other elements normally found in closed loop systems of this nature. As already noted, one of the advantages of the present system is that the hysteresis of the electrodestrictive and magnetostrictive displacements elements will have no effect. In most of the practical applications of the present invention, relatively slow control devices may be used since normally only slow changes of tilt angle are required. For example, such slow movement is acceptable in tilting devices used in three dimensional electron microscopy. The need for a memory to store the reference values corresponding to each tilt angle should again be mentioned. As described above a digital memory which receives inputs from analog to digital converters is desirable. Also as mentioned above, it is preferable to measure the ratio of the opposite capacitors and thus a capacitance bridge capable of determining such a ratio should be provided and the output of that bridge then used as the input to the analog to digital converter.

In addition, it should further be noted that the electronically compensated bearings of the present invention do not have an axis which is strictly defined. Actually, the axis can be placed within certain limits thereby permitting the axis of rotation to be located at different points of a specimen being observed in an electron microscope. This results from the fact that the mechanical bearing inaccuracy are generally very much larger than the virtual accuracy obtainable electronically. Thus it is clear that the axis of rotation can be displaced virtually anywhere within the gap width of the capacitors. For any virtual axis position, once a set of desired set point values is obtained that axis can be repeated. However, if this capability is to be provided, separate sets of set point reference values must be provided for each axis of rotation. This of course will require a memory which is further enlarged to take care of the extra sets of value. Alternatively, a small general purpose digital computer may be used. With such an arrangement it is possible to shift the axis of rotation within a range of microns assuming the capacitors are provided with sufficient gaps. This is of particular value in electron microscope applications since with this capability the specimen need not be adjusted to fall right on the tilt axis. It is only necessary that the specimen be brought into the vicinity of the tilt axis with subsequent adjustment carried out electronically to any required accuracy.

Thus, an improved object adjustment device for a corpuscular beam apparatus such as an electron microscope has been shown. Although specific embodiments have been illustrated and described, it will be obvious to those skilled in the art that various modifications may be made without departing from the spirit of the invention which is intended to be limited solely by the appended claims.

What is claimed is:

1. In a charged particle beam inspection apparatus, the improvement comprising:
a fixed support in an evacuated chamber;
a linearly movable object stage, disposed on said support, and intersected by a first axis which is coincident with the particle beam of the apparatus at the point of its intersection with said object stage;
first means for linearly moving said object stage on said support;
an object carrier for receiving a specimen;
second means coupled to said said object stage for detachably coupling said object carrier to said object stage and releasing said carrier therefrom; and
third means, coupled to said support and disposed below said object stage, for receiving said object carrier from said object stage and supporting said carrier therebelow, said third means being rotatable about a second axis which is not coincident with said first axis, and being mechanically independent of and separate from said object stage and said means for linearly moving said object stage, so that said object carrier is rotatable mechanically independently of said object stage.

2. The apparatus recited in claim 1, wherein said second axis is disposed perpendicular to said first axis.

3. The apparatus recited in claim 2, wherein said third means comprises an elongated rod mounted in said support so as to be rotatable about said second axis and having a recess disposed therein below said object stage of receiving said carrier.

4. The apparatus recited in claim 2, further comprising an object cartridge mounted in said object stage and means, coupled to said object cartridge, for rotating said cartridge about a third axis which is parallel to said first axis.

5. The apparatus recited in claim 2, further comprising means, coupled to said third means, for rotating said object carrier about a fourth axis which is perpendicular to said second axis.

6. The apparatus recited in claim 1, wherein said second axis is disposed at an angle of between approximately 0° to 90° with respect to said first axis, and wherein said means for linearly moving said object stage moves said stage in a plane which is disposed perpendicular to said second axis.

7. The apparatus recited in claim 1, wherein said second means comprises a plurality of moveable grippers disposed about the periphery of said object stage for removably coupling said object carrier to said stage.

8. The apparatus recited in claim 3, wherein said rod further comprises a sleeve moveably secured in said recess for receiving said object carrier.

9. The apparatus recited in claim 8, wherein said rod further comprises spring means for moveably securing said sleeve in said recess.

10. The apparatus recited in claim 3, wherein said object carrier comprises two separate parts moveably coupled to each other and each slidable with respect to the other, one of said parts being disposable in said recess and the other of said parts containing the object.

11. The apparatus recited in claim 10, wherein said object carrier parts are moveably coupled by adhesion.

12. The apparatus recited in claim 10, wherein said object carrier parts are moveably coupled by spring means.

13. The apparatus recited in claim 3, wherein said recess includes adhesive means for securing said object carrier therein.

14. The apparatus as recited in claim 6, wherein said third means comprises a rotatable disc rotatably mounted in the apparatus, and drive means, coupled to said disc and operable externally of the apparatus, for rotating said disc.

* * * * *

UNITED STATES PATENT AND TRADEMARK OFFICE
CERTIFICATE OF CORRECTION

PATENT NO. : 3,952,203

DATED : April 20, 1976

INVENTOR(S) : Walter Hoppe

It is certified that error appears in the above–identified patent and that said Letters Patent are hereby corrected as shown below:

In Column 8, line 49, change "annular" to --angular--

Signed and Sealed this

Sixth Day of July 1976

[SEAL]

Attest:

RUTH C. MASON
Attesting Officer

C. MARSHALL DANN
Commissioner of Patents and Trademarks